United States Patent [19]

Bluethman et al.

[11] Patent Number: 5,051,994

[45] Date of Patent: Sep. 24, 1991

[54] COMPUTER MEMORY MODULE

[75] Inventors: Robert G. Bluethman, Austin; Donald J. Willson, Leander, both of Tex.

[73] Assignee: International Business Machines Corporation, Armonk, N.Y.

[21] Appl. No.: 345,323

[22] Filed: Apr. 28, 1989

[51] Int. Cl.[5] ................. G11C 17/00; G06F 11/20
[52] U.S. Cl. ..................... 371/11.1; 364/245.3; 365/200
[58] Field of Search .......... 371/11.1, 10.1, 10.2; 365/200; 364/200 MS File, 900 MS File

[56] References Cited

U.S. PATENT DOCUMENTS

| | | | |
|---|---|---|---|
| 3,644,902 | 2/1972 | Beausoleil | 365/200 |
| 3,681,757 | 8/1972 | Allen et al. | 371/11.1 |
| 3,714,637 | 1/1973 | Beausoleil | 365/200 |
| 3,735,368 | 5/1973 | Beausoleil | 365/200 |
| 3,765,001 | 10/1973 | Beausoleil | 365/200 |
| 3,781,826 | 12/1973 | Beausoleil | 371/11.1 |
| 3,845,476 | 10/1974 | Boehm | 365/200 |
| 3,897,626 | 8/1975 | Beausoleil | 371/11.1 |
| 4,092,733 | 5/1978 | Coontz et al. | 365/200 |
| 4,303,993 | 12/1981 | Panepinto, Jr. et al. | 365/230 |
| 4,355,376 | 10/1982 | Gould | 365/200 |
| 4,365,318 | 12/1982 | Aichelmann, Jr. et al. | 365/200 |
| 4,527,251 | 7/1985 | Nibby, Jr. et al. | 364/900 |
| 4,633,429 | 12/1986 | Lewandowski et al. | 365/189.05 |
| 4,688,220 | 8/1987 | Pelgrom | 371/11.1 |

OTHER PUBLICATIONS

R. F. Meyers et al., "Use of Partially Good Memory Chips", IBM Technical Disclosure Bulletin, vol. 21, No. 9, 2/79, p. 3583.
R. H. Kruggel et al., "Partially Good RAM Chip Part Number Reduction by Alterable Steering to I/O Pads", IBM Technical Disclosure Bulletin, vol. 28, No. 1, 6/85, p. 10.
L. L. Chiriatti, "Half-Good Memory Program", IBM Technical Disclosure Bulletin, vol. 15, No. 11, 4/73, p. 3453.

Primary Examiner—Charles E. Atkinson
Attorney, Agent, or Firm—Andrea P. Bryant

[57] ABSTRACT

A method and apparatus for efficiently and economically using partially good memory modules to construct a memory unit of predetermined aggregate capacity is described, using a universal wiring pattern on a substrate, including positions thereon with circuitry adapted for connecting to data outputs from a plurality of partially good memory modules, memory unit data output circuitry, and selectively interconnectable—during a final manufacturing step—lines associated with memory module data outputs and with the memory unit data outputs, thereby enabling connection of data outputs from good sections of the partially good memory modules to memory unit data outputs.

9 Claims, 5 Drawing Sheets

SELECTION MATRIX

| COMBI-NATION | MODULE TYPE IN LOC. A | MODULE TYPE IN LOC. B | MODULE TYPE IN LOC. C | MODULE TYPE IN LOC. D | MODULE TYPE IN LOC. E | JUMPER 1 RESISTOR | JUMPER 2 RESISTOR |
|---|---|---|---|---|---|---|---|
| 1 | 1 | | 1 | | 1 | R1 | R4 |
| 2 | 2 | | 2 | | 2 | R1 | R4 |
| 3 | 3 | | 3 | | 3 | R1 | R5 |
| 4 | 4 | | 4 | | 4 | R2 | R5 |
| 5 | 5 | 5 | 5 | | 1 | R1 | R4 |
| 6 | 6 | 6 | 6 | | 1 | R1 | R5 |
| 7 | 7 | 7 | 7 | | 1 | R1 | R6 |
| 8 | 8 | 8 | 8 | | 1 | R2 | R5 |
| 9 | 9 | 9 | 9 | | 1 | R2 | R6 |
| 10 | 10 | 10 | 10 | | 1 | R3 | R6 |
| 11 | 5 | 5 | 5 | | 2 | R1 | R4 |
| 12 | 6 | 6 | 6 | | 2 | R1 | R5 |
| 13 | 7 | 7 | 7 | | 2 | R1 | R6 |
| 14 | 8 | 8 | 8 | | 2 | R2 | R5 |
| 15 | 9 | 9 | 9 | | 2 | R2 | R6 |
| 16 | 10 | 0 | 10 | | 2 | R3 | R6 |
| 17 | 5 | 5 | 5 | | 3 | R1 | R4 |
| 18 | 6 | 6 | 6 | | 3 | R1 | R5 |
| 19 | 7 | 7 | 7 | | 3 | R1 | R6 |
| 20 | 8 | 8 | 8 | | 3 | R2 | R5 |
| 21 | 9 | 9 | 9 | | 3 | R2 | R6 |
| 22 | 10 | 10 | 10 | | 3 | R3 | R6 |
| 23 | 5 | 5 | 5 | | 4 | R1 | R4 |
| 24 | 6 | 6 | 6 | | 4 | R1 | R5 |
| 25 | 7 | 7 | 7 | | 4 | R1 | R6 |
| 26 | 8 | 8 | 8 | | 4 | R2 | R5 |
| 27 | 9 | 9 | 9 | | 4 | R2 | R6 |
| 28 | 10 | 10 | 10 | | 4 | R3 | R6 |
| 29 | 5 | 5 | 5 | 5 | 5 | R1 | R4 |
| 30 | 6 | 6 | 6 | 6 | 6 | R1 | R5 |
| 31 | 7 | 7 | 7 | 7 | 7 | R1 | R6 |
| 32 | 8 | 8 | 8 | 8 | 8 | R2 | R5 |
| 33 | 9 | 9 | 9 | 9 | 9 | R2 | R6 |
| 34 | 10 | 10 | 10 | 10 | 10 | R3 | R6 |

FIG. 3A

SELECTION MATRIX

| COMBI-NATION | JUMPER 3 RESISTOR | JUMPER 4 RESISTOR | JUMPER 5 RESISTOR | JUMPER 6 RESISTOR | JUMPER 7 RESISTOR | JUMPER 8 RESISTOR | JUMPER 9 RESISTOR |
|---|---|---|---|---|---|---|---|
| 1 | R7 | R15 | R17 | R21 | R26 | R29 | R32 |
| 2 | R8 | R15 | R17 | R22 | R26 | R29 | R33 |
| 3 | R8 | R15 | R18 | R22 | R26 | R30 | R33 |
| 4 | R8 | R19 | R18 | R22 | R27 | R30 | R33 |
| 5 | R9 | R12 | R16 | R20 | R26 | R29 | R32 |
| 6 | R9 | R13 | R16 | R21 | R26 | R29 | R32 |
| 7 | R9 | R14 | R16 | R22 | R26 | R29 | R32 |
| 8 | R10 | R13 | R17 | R21 | R26 | R29 | R32 |
| 9 | R10 | R14 | R17 | R22 | R26 | R29 | R32 |
| 10 | R11 | R14 | R18 | R22 | R26 | R29 | R32 |
| 11 | R9 | R12 | R16 | R20 | R26 | R29 | R33 |
| 12 | R9 | R13 | R16 | R21 | R26 | R29 | R33 |
| 13 | R9 | R14 | R16 | R22 | R26 | R29 | R33 |
| 14 | R10 | R13 | R17 | R21 | R26 | R29 | R33 |
| 15 | R10 | R14 | R17 | R22 | R26 | R29 | R33 |
| 16 | R11 | R14 | R18 | R22 | R26 | R29 | R33 |
| 17 | R9 | R12 | R16 | R20 | R26 | R30 | R33 |
| 18 | R9 | R13 | R16 | R21 | R26 | R30 | R33 |
| 19 | R9 | R14 | R16 | R22 | R26 | R30 | R33 |
| 20 | R10 | R13 | R17 | R21 | R26 | R30 | R33 |
| 21 | R10 | R14 | R17 | R22 | R26 | R30 | R33 |
| 22 | R11 | R14 | R18 | R22 | R26 | R30 | R33 |
| 23 | R9 | R12 | R16 | R20 | R27 | R30 | R33 |
| 24 | R9 | R13 | R16 | R21 | R27 | R30 | R33 |
| 25 | R9 | R14 | R16 | R22 | R27 | R30 | R33 |
| 26 | R10 | R13 | R17 | R21 | R27 | R30 | R33 |
| 27 | R10 | R14 | R17 | R22 | R27 | R30 | R33 |
| 28 | R11 | R14 | R18 | R22 | R27 | R30 | R33 |
| 29 | R9 | R12 | R16 | R20 | R23 | R28 | R31 |
| 30 | R9 | R13 | R16 | R21 | R23 | R28 | R32 |
| 31 | R9 | R14 | R16 | R22 | R23 | R28 | R33 |
| 32 | R10 | R13 | R17 | R21 | R24 | R29 | R32 |
| 33 | R10 | R14 | R17 | R22 | R24 | R29 | R33 |
| 34 | R11 | R14 | R18 | R22 | R25 | R30 | R33 |

COMPUTER MEMORY MODULE

BACKGROUND

1. Field of the Invention

This invention relates to computer memory. More particularly, it relates to constructing a memory unit having a given capacity from a plurality of partially good memory modules, where the location of the usable portion in each memory module is known.

2. Description of the Prior Art

The desire to use partially good memory modules has existed for some time in order to minimize the expense associated with scrapping defective modules. Traditional, conventional efforts to utilize partially defective memory modules have to do with alternate addressing schemes for avoiding the defective area. References illustrative of this aspect of the prior art include U.S. Pat. No. 3,845,476 to Boehm, commonly assigned, which uses address translation to avoid bad memory sections and teaches a method of making a monolithic memory. The reference requires that a combination of memory chips include at least one all-good chip and further teaches programmable means connected between the translation means and the chips for assuring that certain addressing signals correspond to the address of a defective chip sector irrespective of which one of the sectors in the partially defective chip is actually defective.

It is known in the art to predetermine the configuration of good memory capacity in a partially defective memory module. This feature is described with respect to memory chips in IBM Technical Disclosure Bulletin, Vol. 21, No. 9, Feb., 1979, p. 3582 to Meyers et al and commonly assigned U.S. Pat. No. 3,735,368 to W. F. Beausoleil.

Meyers et al sort memory chips which are partially defective into ten categories; eight, where seven-eighths of the memory chip is good and two, where the chip is half good. These chips are combined in a manner which results in a single unit part number, logically equivalent to a unit having four all good memory chips.

IBM Technical Disclosure Bulletin, Vol. 15, No. 11, April 1973, page 3453 to Chiriatti combines two types of half good memory chips to substitute for units containing all good memory chips of equal memory capacity without modifying the card on which the units are mounted and without requiring logic circuit transformation.

IBM Technical Disclosure Bulletin, Vol 1, No. 1, June, 1985, page 10 to Kruggel et al uses alterable steering devices to assure that good memory circuits are connected to certain identified I/O pads. Thus all chips having an equal number of good circuits are assigned a single part number regardless of possible difference in physical location of the failures.

This article discloses a capability of interchanging I/O connections between chip circuits and unit pins in a partially good chip. One of the data I/O circuits is designated as a replacement circuit for any other which might be found defective. A good circuit is connected to an I/O pad intended for the circuit found defective by means of fuse blowing or any of several laser methods.

Kruggel et al appear to require that partially good chips have the same number of defective sections, whereas the present invention contemplates a mixture of half, three-quarter and full or any combination thereof of good units to comprise a single memory SIMM.

Kruggel et al is similar, somewhat, to the present invention in they make all connections and then selectively break some whereas in the present invention we selectively make connections between data output lines from memory modules and output terminals on a substrate.

Because of the tremendous cost associated with high volume manufacturing operations, it is desirable to be able to use partially defective memory modules in constructing memory units of a given size or aggregate capacity. In the course of manufacturing memory modules, prediction of the configuration of defective bits in a given lot is difficult. Some defects occur at wafer level while others show up only after a module is built. Since it is difficult to predict precise, usable bit configurations available from a given wafer manufacturing run, even a slight shift in process parameters can result in vast differences in partially good bit configurations. Such partially defective modules are often scrapped.

It is possible to prepare in advance for all possible partially good bit configurations but such a situation requires maintaining on hand a very large number of substrates, each circuitized in predetermined wiring patterns to accommodate the various possible combinations of partially good modules.

SUMMARY OF THE INVENTION

The present invention represents an improvement over the prior art, as above discussed, in that it contemplates the use of a single printed wiring pattern for constructing computer memory units having a given capacity from a mix of partially good memory modules having a mix of usable bit configurations by providing means for connecting appropriate, i.e. good, memory module bit lines to memory unit output lines formed in the wiring pattern. This means for connecting may take the form of a shorting jumper for each of the predetermined good bit lines.

The invention allows a choice of a plurality of partially good memory module bit line configurations to be used, as available, while requiring only substrates with a single common wiring pattern to be maintained in inventory to support the many possible combinations of partially good memory modules which may arise in a high volume manufacturing environment.

In practice, the invention may be embodied in one wiring pattern for surface mountable memory modules and another for pin-through-hole memory modules.

BRIEF DESCRIPTION OF THE DRAWING

The above and other features and advantages will be better understood having reference to the following description taken in connection with the drawing wherein like reference numerals are used throughout the various figures to denote the same elements and wherein.

DESCRIPTION OF THE PREFERRED EMBODIMENT

The present invention will be described having reference to a particular, exemplary embodiment wherein a single in line memory unit (SIMM) of a given storage capacity is to be constructed from a plurality of individual memory modules at least one of which has less than all good sections.

Figure 1:
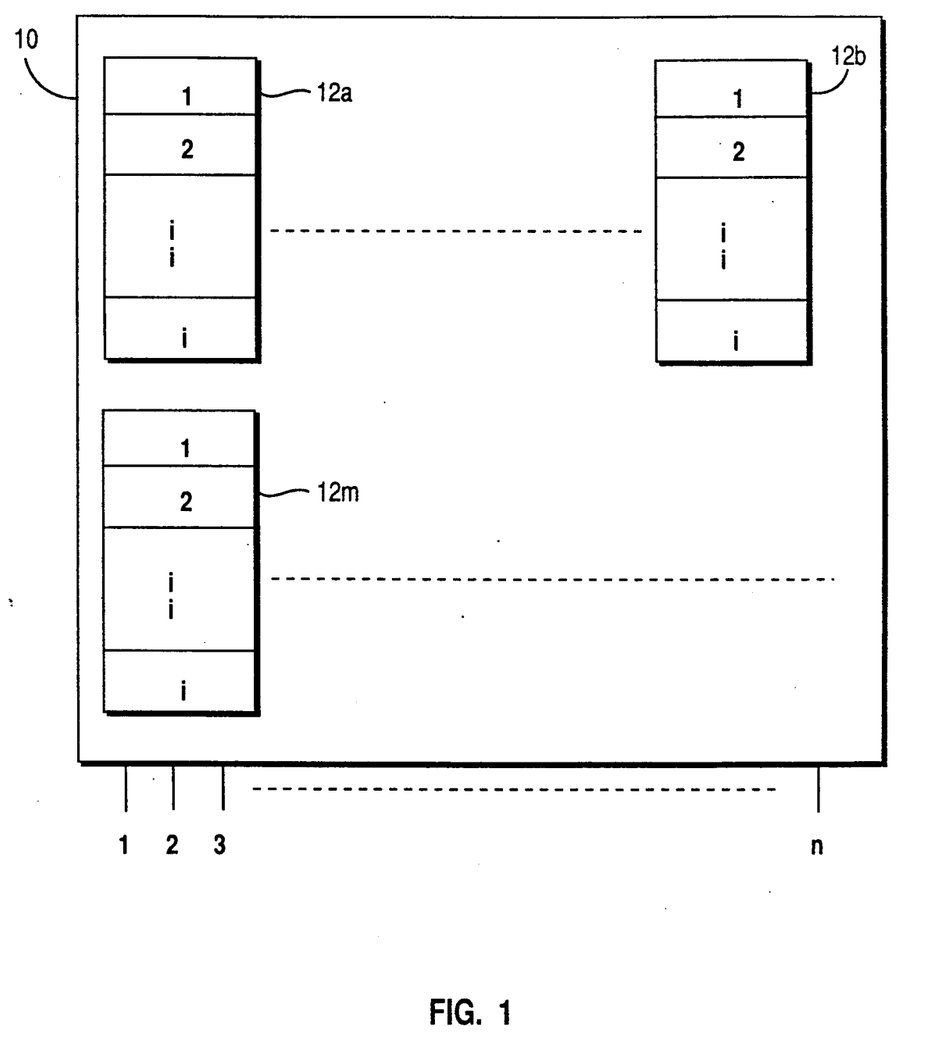
FIG. 1 is a schematic illustration of a memory unit providing a predetermined storage capacity configured from a plurality of memory modules.

Refer to FIG. 1, a memory unit indicated generally at 10, is schematically illustrated as comprising a plurality m of individual memory modules, 12a, 12b... 12m. Each memory module 12a...12m has i data sections, at least one of which represents good, usable, memory capacity.

It should be clear that each memory module 12a...12m shown has been greatly simplified to facilitate the description of the invention. Those having skill in the art will understand that each memory module may be a complex multidimensional matrix memory device, such as a 256K×4 bit device with four 256K bit outputs.

As shown in FIG. 1, up to n data output lines are available from memory unit 10. Each memory module position 12 may provide 1 to i of the data outputs n, where i is less than n. Not every module location, however, needs to be used.

The present invention contemplates using individual memory modules 12a...12m which have a number of good sections from 1 to i and that the number of good sections is not necessarily the same for each memory module.

Figure 2:
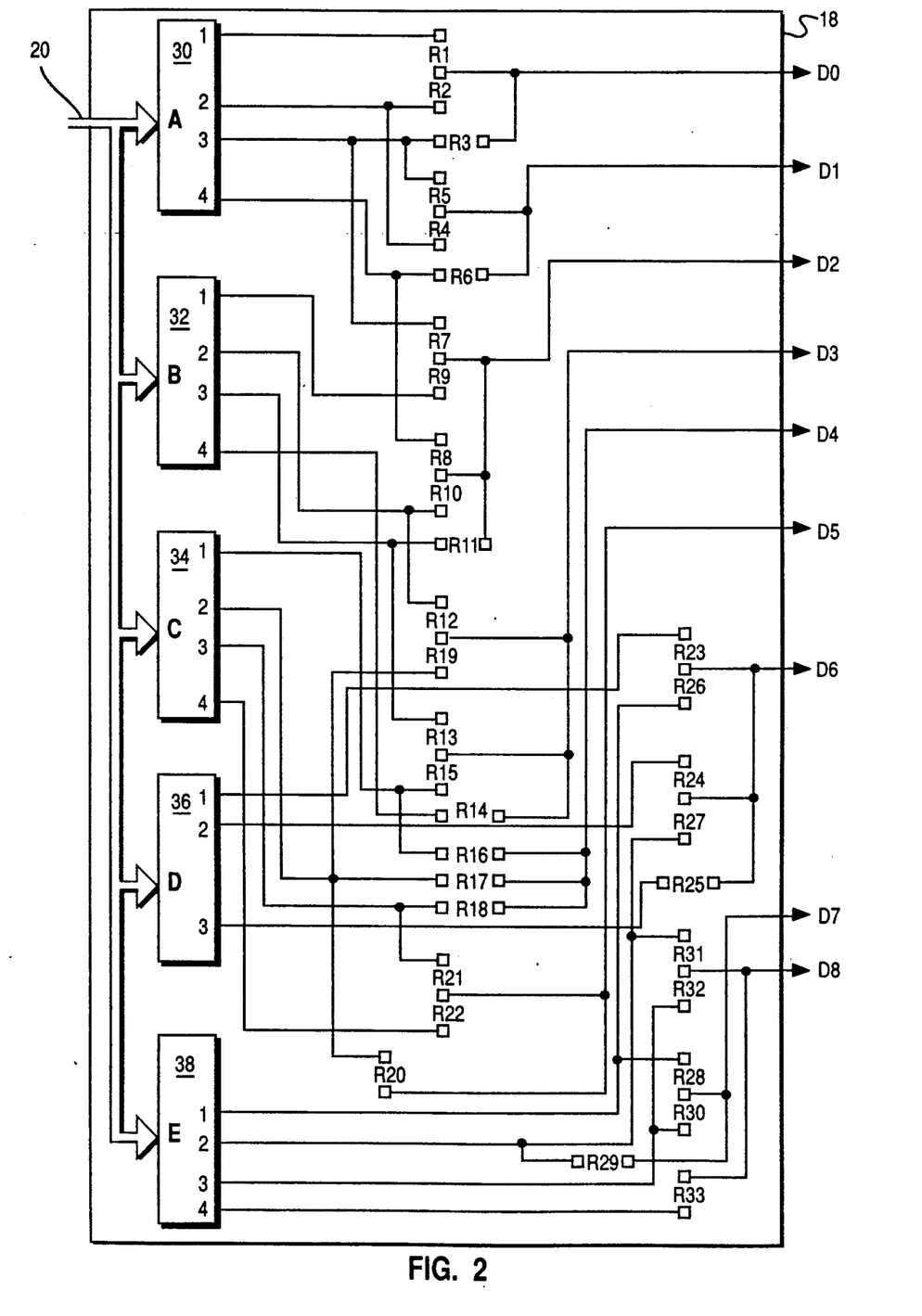
FIG. 2 is a schematic wiring diagram for a memory unit in accordance with the present invention.
Figure 4:
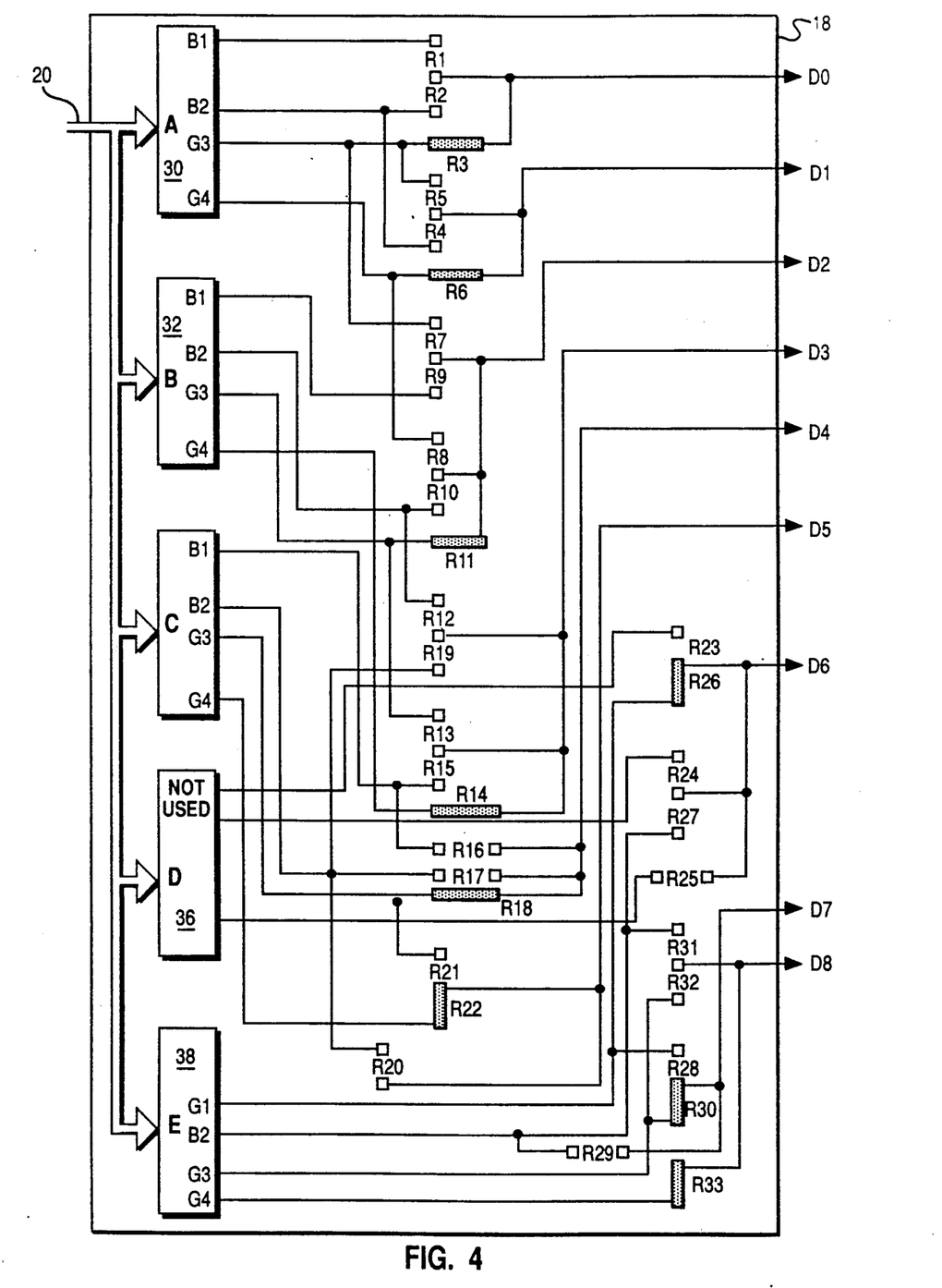
FIG. 4 is a diagram similar to that of FIG. 2, having jumper connections made in accordance with the present invention.

In the particular illustrative embodiment of the invention shown in FIGS. 2 and 4, the full capacity of memory unit 10 is desired to be 256K×9 bits. Each memory module 12a, 12b...12m is a 256K×4 bit matrix memory. In the course of manufacturing, yield defects may cause a number of chips in individual memory modules to be defective, thereby rendering the memory module only partially good. It is well known to sort memory units based on the location of their defective sections. In the present invention, partially good modules of interest are configured as 256K×2 and 256K×3 bits. Strictly as a matter of choice, partially good modules having only 256K×1 bit capacity are not used. Similarly, all-good modules may be used but as a matter of choice are not included in the description.

A worst case analysis of partially good bit configurations in the present example and results in a need for over 8,000 possible wiring patterns, that is, individually designed substrates to accommodate the various combinations of partially good modules to yield a memory unit having the requisite 256K×9 bit capacity. The number of distinct wiring patterns can be significantly decreased if the type and number of partially good modules is limited. For example, if it were chosen to use only three, three-quarter good modules all having the same defective bit locations or five half-good modules all with the same defective bit location or one three-quarter good module plus three half-good units, all having the same defective bit location, (three types of partially good memory module configurations) still 34 distinct substrate wiring patterns would be required. Clearly in the high volume manufacturing environment of today, where emphasis is placed on reducing required parts inventory, such a result is not satisfactory.

The present invention, however, provides that a single wiring pattern on a substrate enables the use of any mix, within certain predetermined limitations, of partially good memory module configurations in order to achieve a memory unit of a predetermined capacity.

Thus what is shown in the FIGS. is provided by way of illustration only, and demonstrates a particular preferred embodiment. Those having skill in the art will understand that other limiting factors may be chosen.

In FIG. 2, address and control information enters memory unit substrate 18 on bus 20. Information on bus 20 is distributed to each of five possible memory module positions on memory unit substrate 18. Memory module positions 30, 32, 34, 36, 38 on memory unit substrate 18 are adapted to receive any of a predetermined limited set of partially good memory modules (12a...12m, FIG. 1). Suitable printed circuitry is provided by means well known in the art on memory unit substrate 18 and adapted to connect up to four (i, FIG. 1) outputs from memory modules at locations 30, 32, 34, 36 and 38 with memory unit substrate 18 data output lines shown in FIG. 2 as D0 through D8.

In accordance with the present invention, a plurality of alternate connection paths exist between data outputs from memory modules at locations 30, 32... 38 and memory unit substrate 18 data output lines D0-D8. Individual connections are enabled by means of 33 jumper element positions shown in FIG. 2 as R1-R33. The choice of connection sites, R1-R33, is made in accordance with the particular set of partially good memory modules located at memory module locations 30-38. The number of jumper element positions used in any particular application corresponds to the number of data outputs from the memory unit.

The general case implemented in the present invention is obviously subject to designer's choice for the number of possible partially good module combinations to be allowed for practical reasons. A table may be constructed, such as that illustrated in FIGS. 3A and 3B to show all allowable bit line and good/bad configurations.

As earlier discussed, three categories of combinations of partially good units have been chosen for use in describing the principles of the present invention. The first category includes three, three-quarter good to yield a 256K×9 bits and the second includes three half-good and one three-quarter good to yield a total of 256K×9 bits and the third category includes five half good memory modules, one more than necessary. This third type of possible combinations gives ten bits, one more than necessary in this example. It should be noted that without the present invention, all of the partially good modules would more than likely find themselves in the scrap heap.

Figure 3A:
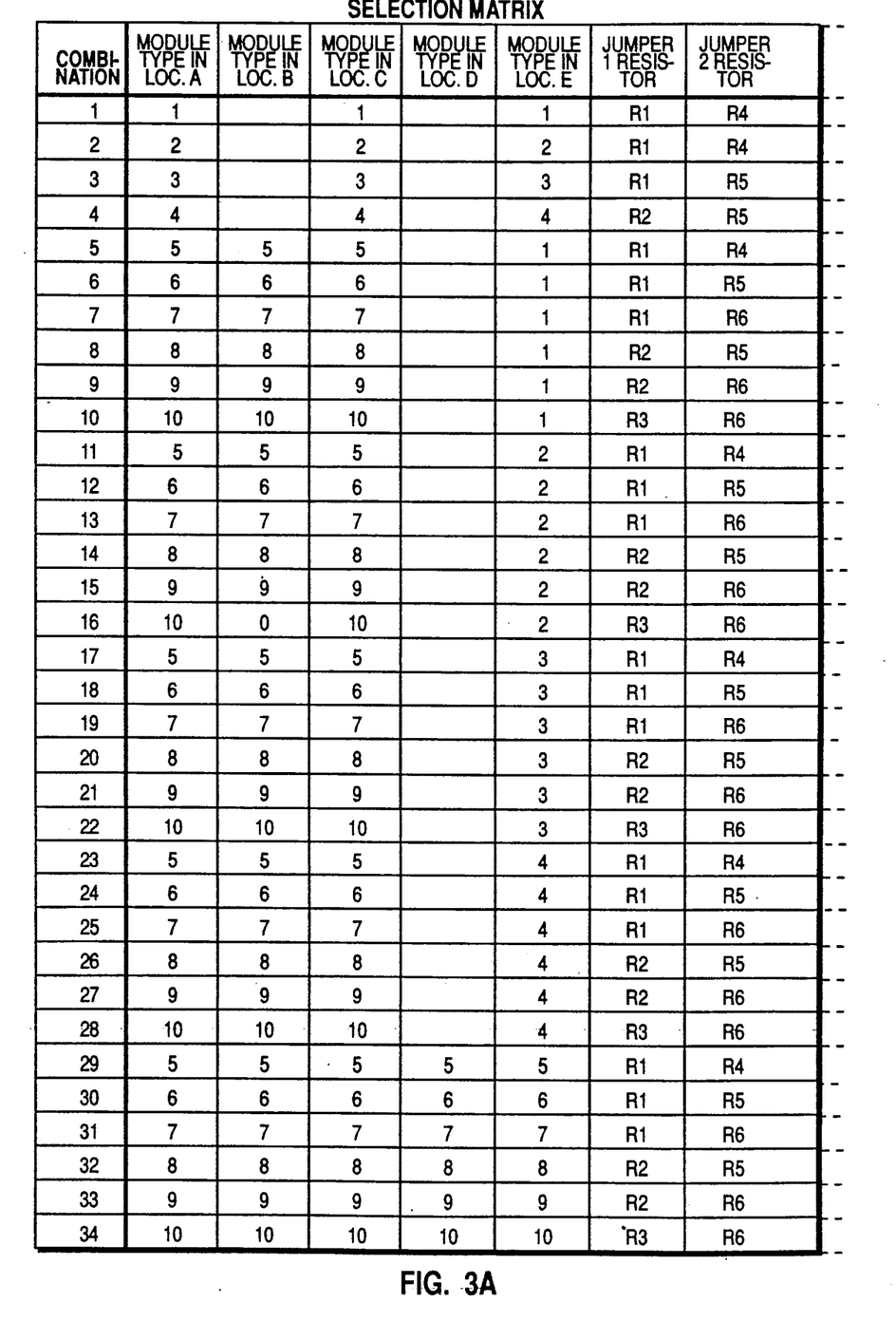
FIGS. 3A and 3B together show an exemplary jumper connection site location matrix.
Figure 3B:
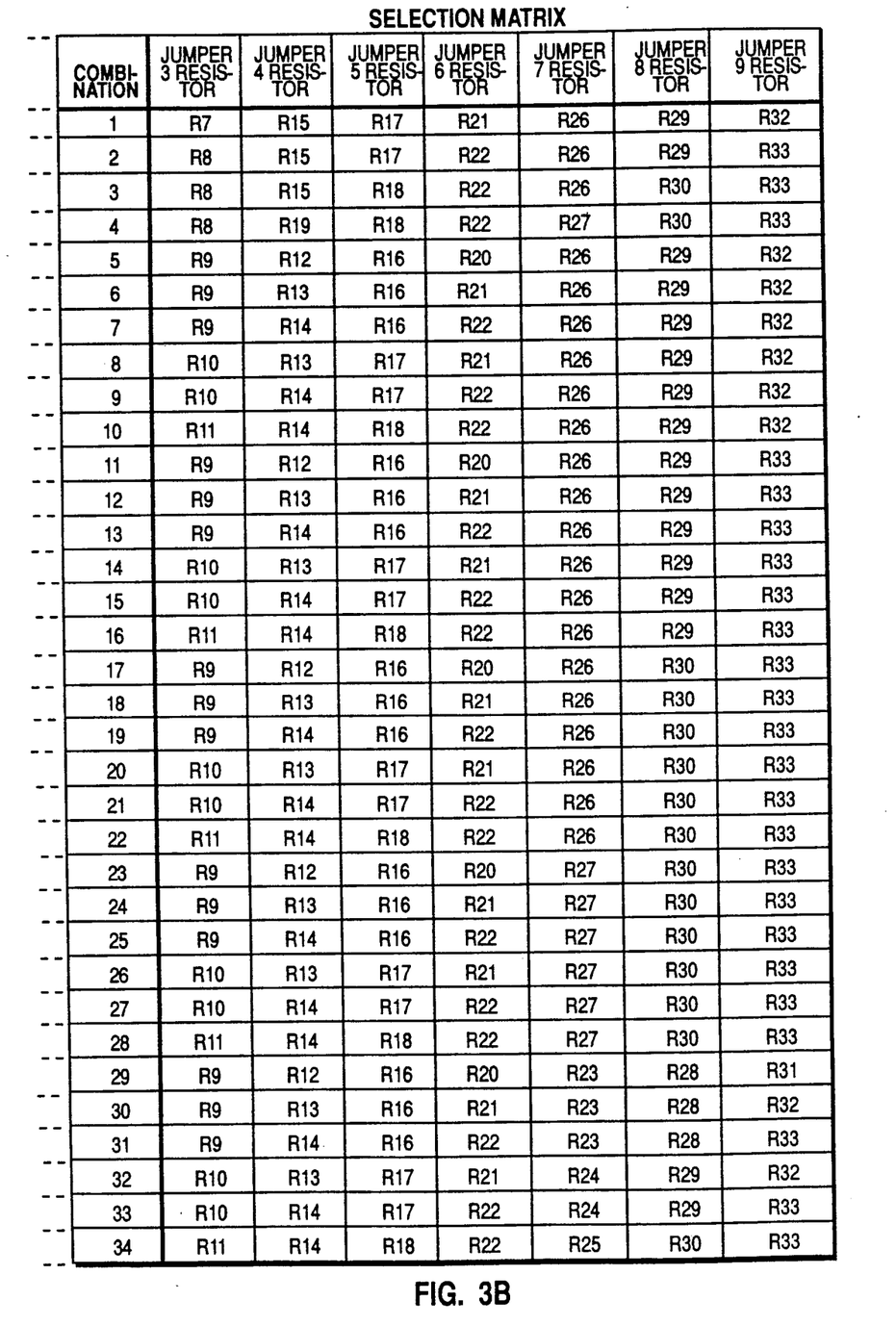

In FIGS. 3A and 3B, ten of the possible partially good memory module configurations have been chosen as shown below in TABLE I. Note, modules with all good sections or only one good section are not included.

TABLE I

| Module Type | Good Bit Lines | | | |
| --- | --- | --- | --- | --- |
| | 1 | 2 | 3 | 4 |
| 1 | X | X | X | |
| 2 | X | X | | X |
| 3 | X | | X | X |

TABLE I-continued

| Module Type | Good Bit Lines | | | |
|---|---|---|---|---|
| | 1 | 2 | 3 | 4 |
| 4 | | X | X | X |
| 5 | X | X | | |
| 6 | X | | X | |
| 7 | X | | | X |
| 8 | | X | X | |
| 9 | | X | | X |
| 10 | | | X | X |

The first four Types are various three-quarter good memory module configurations. Types five-ten represent half-good memory module configurations.

There are 34 combinations of the ten partially good module Types set out in FIGS. 3A and 3B. Also included are columns showing which module Type is to be placed at which module location (30-38, FIG. 2) on the memory unit substrate based on configuration Type.

Note that Combinations 1-4 use three ¾-good modules, and that for each Combination the same Type module is used. Combinations 5-28 each use one ¾-good module Type and three same Type half-good modules Finally, Combinations 29-34 use five half-good, same Type modules. This set of Combinations is the result of a choice made in an effort to optimize use of available partially good modules while keeping manufacturing logistical considerations within reasonable bounds.

The remaining nine columns, one per jumper element, indicate which jumper connections are to be made for each of the possible 34 combinations of partially good memory modules when constructing a unit possessing the total requisite storage capacity. Obviously the number of FIGS. 3A and 3B Selection Matrix table entries may be increased if other combinations of partially good memory module configurations are chosen, their sizes vary, or the predetermined capacity of the memory unit to be constructed varies from that of the example. In each case, however, the relationship is governed by:

when n is the desired number of data output lines from the unit to be constructed;

k is the number of good sections per module, each module may have up to i good sections, k is not equal in each of the set of units, and $1 \leq k \leq i$;

m is the number of memory modules, $$[\text{next integer} > n/i] \leq m \leq n$$

In the exemplary implementation shown in FIG. 4, the partially good memory modules chosen for locations 30, 32 and 34 are each half good and have sections 1 20 and 2 bad. Module location 36 is not used; and the module placed at location 38 has only one bad section. B's indicate bad module sections; G's, good module sections. This corresponds to combination 22 of FIG. 3.

Jumper element positions R3, R6, R11, R14, R18, R22, R26, R30 and R33 are the connection points chosen using the table in FIG. 3. Thus, after placement of jumper elements which are in a preferred embodiment surface mount resistors, at those positions above noted, data outputs are enabled on memory unit 18 outputs D0 and D1 from the module at position 30; on outputs D2 and D3 from the module at position 32; on outputs D4 and D5 from the module at position 34; and on outputs D6 D7 and D8 from the memory module at position 38.

This exemplary embodiment has been described having reference to a schematic diagram of a wiring pattern necessary on a substrate for a memory unit. Those having skill in the art will appreciate that in practice, two or more wiring patterns may be required to accommodate various kinds of memory modules. For example, memory modules of the same capacity or potential capacity may be manufactured as surface mountable components or as pin-through-hole components. However, the principles of the present invention are still applicable.

In the present example, if memory modules placed in positions 30, 32, 34, 36 and 38 are pin-through-hole modules, the programming jumper connections R1 through R33 may be implemented by backside wiring using via holes in the substrate. Similarly, if the memory modules, at least one of which is only partially good, are surface mountable devices, programming jumper connections may be made across lines on the same surface of memory unit substrate 18.

In either case, conventional high volume manufacturing processes are used to implement the present invention, thereby realizing a great advantage in cost savings, not only from utilizing partially good memory modules which would otherwise have been scrapped, but in the tremendous savings on inventory since a single substrate wiring pattern may be used for structuring a memory unit comprising a plurality of individually configured, partially good, memory modules.

Significantly, with the addition of only 2 more jumper element positions to the wiring pattern in FIGS. 2 and 4, combinations including all-good memory modules could be realized. Specifically, a jumper element position allowing connection of data output line 4 of module location 30 to unit data output D3 and a jumper element position allowing connection of data output line 1 of module location 38 to unit data output D5 could allow use of all-good modules at locations 30 and 38. The addition of these two jumper elements positions provides 30 more combinations such as those listed in FIGS. 3A and 3B.

While the present invention has been described having reference to a particular embodiment and modifications thereto, those having skill in the art will understand the various changes in form and detail may be made without departing from the spirit and scope of the invention as claimed.

We claim:

1. For use in constructing a computer memory unit of predetermined storage capacity from a plurality of partially good memory modules of known storage capacity, a memory unit wiring substrate including:
   circuitry for conducting data outputs from partially good memory modules mounted on the substrate;
   memory unit data output lines; and
   means for selectively coupling said circuitry for conducting to said memory unit data output lines.

2. The memory unit wiring substrate of claim 2 wherein said means for selectively coupling comprises:
   jumper elements equal in number to said memory unit data output lines.

3. The memory unit wiring substrate of claims 1 or 2 wherein said partially good memory modules comprise:
   a group of partially good memory modules containing in toto at least said predetermined storage capacity.

4. A universal memory unit wiring substrate for use in constructing a memory unit having n data outputs, from a plurality of memory modules, at least one of which may be partially good, characterized by amount and location of usable storage, and taken together providing at least n data outputs, comprising:
- m sites for attachment of memory modules;
- circuitry for conducting data output lines from said m sites; and
- n connector means for interconnecting said n data outputs with selected portions of said circuitry for conducting, associated with n usable data output lines available from said m sites.

5. A memory unit providing a certain total storage capacity and a number of data outputs, constructed from a plurality of individual memory modules of an equal nominal capacity wherein at least one of said individual memory modules is partially good, comprising:
- a printed circuit substrate adapted to receive a set of memory modules, containing in combination in their good sections at least said certain total storage capacity, at positions thereon including module data output lines, greater in quantity than said memory unit data outputs;
- a set of jumper elements equal in number to said memory unit data outputs, said jumper elements selectively positionable during final memory unit assembly for connecting module data output lines from good module sections to predetermined ones of said number of memory unit data outputs.

6. A memory unit having n data outputs for providing a given amount of storage capacity, assembled from a plurality of partially good memory modules, together at least said given storage capacity, locations of all usable memory module sections being known, comprising:
- a printed circuit substrate adapted to receive a number of said plurality of memory modules at positions thereon;
- circuitry on said printed circuit substrate, selectably connectable to said positions and to said n data outputs; and
- n jumper means positionable during final memory unit assembly for connecting n usable memory module sections to said n data outputs.

7. A method of making a memory unit having a predetermined aggregate storage capacity comprising the steps of:
- providing a standard wiring pattern on a printed circuit substrate including
  - a set of unit data outputs,
  - a plurality of memory module receiving sites each having suitable module data output lines, and
  - incomplete, alternative conductive paths therebetween;
- placing partially good memory modules, chosen as a function of amount and location of their good sections so as to at least equal said predetermined aggregate storage capacity, at said module receiving sites; and
- selectively completing sufficient ones of said incomplete, alternative conductive paths from module data output lines from good sections of said partially good memory modules to the unit data output lines.

8. A method of making a memory unit having a predetermined capacity comprising the steps of:
- selecting from a presorted plurality of partially good memory modules a number $\leq m$ of memory modules, having in the aggregate said predetermined storage capacity;
- providing a substrate containing an incomplete pattern of circuitry connecting m locations adapted to receive memory modules to a number n of data output connect tabs;
- attaching said $\leq m$ selected memory modules to said locations; and
- selectively making n connections in said incomplete pattern of circuitry.

9. A method of making $C \times n$ memory unit from a plurality m of $C \times i$ modules, where C is the number of memory bits in each section i of the memory modules, comprising the steps of:
- a. sorting partially good memory modules of nominal capacity $C \times i$ by amount of usable memory and location thereof;
- b. providing a substrate with a universal wiring pattern including n memory unit outputs, m module sites, i data outputs from each module site, each of said $(m \times i)$ outputs being connectable to one or more of said n unit outputs;
- c. structuring a table correlating a plurality of combinations of $\leq m$ sorted partially good memory modules, each combination containing, in aggregate, storage capacity greater than or equal to $C \times n$, with a set of n connection sites in said universal wiring pattern;
- d. selecting a combination of $\leq m$ modules from said table;
- e. mounting said combination of $\leq m$ modules on said substrate; and
- f. making n connections between said n unit outputs and a subset of said $(m \times i)$ outputs.

* * * * *

UNITED STATES PATENT AND TRADEMARK OFFICE
CERTIFICATE OF CORRECTION

PATENT NO. : 5,051,994

DATED : September 24, 1991

INVENTOR(S) : Robert G. Bluetham, et al.

It is certified that error appears in the above-identified patent and that said Letters Patent is hereby corrected as shown below:

Column 6, line 56, delete "claim 2" and insert --claim 1--.

Signed and Sealed this

Twenty-third Day of March, 1993

Attest:

STEPHEN G. KUNIN

*Attesting Officer*  *Acting Commissioner of Patents and Trademarks*